(12) United States Patent
Webb et al.

(10) Patent No.: US 6,936,869 B2
(45) Date of Patent: Aug. 30, 2005

(54) HETEROJUNCTION FIELD EFFECT TRANSISTORS USING SILICON-GERMANIUM AND SILICON-CARBON ALLOYS

(75) Inventors: Douglas A. Webb, Phoenix, AZ (US); Michael G. Ward, Phoenix, AZ (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/191,664

(22) Filed: Jul. 9, 2002

(65) Prior Publication Data

US 2004/0007715 A1 Jan. 15, 2004

(51) Int. Cl.$^7$ ............................................. H01L 31/0328
(52) U.S. Cl. ........................... 257/192; 257/19; 257/20; 257/22; 257/24; 257/77; 257/197
(58) Field of Search ............................... 257/19, 20, 22, 257/24, 77, 192, 194, 195, 197, 15, 190, 280, 281, 18, 21, 198

(56) References Cited

U.S. PATENT DOCUMENTS

| | | | |
|---|---|---|---|
| 5,221,413 A | | 6/1993 | Brasen et al. |
| 5,986,287 A | * | 11/1999 | Eberl et al. .................... 257/77 |
| 6,107,653 A | | 8/2000 | Fitzgerald |
| 6,403,975 B1 | * | 6/2002 | Brunner et al. ................ 257/15 |
| 6,607,948 B1 | * | 8/2003 | Sugiyama et al. .......... 438/151 |
| 6,690,043 B1 | * | 2/2004 | Usuda et al. ............... 257/194 |

OTHER PUBLICATIONS

E.A. Fitzgerald, et al., Applied Physics Letters 59, p. 811 (1991).
D.J. Paul, et al., Thin Solid Films, 321, p. 181 (1998).
D.V. Singh, T.O. Mitchell, J.L. Hoyt, J.F. Gibbons, N.M. Johnson and W.K. Gotz, "Effect of grown–in deep level defects in Si1–yCy/Si epitaxial heterostructures," Physica B, vol. 273–274, pp. 681–684, 1999.

D.V. Singh, K. Rim, T.O. Mitchell, J.L. Hoyt and J.F. Gibbons, "Measurement of the Conduction Band Offsets in Si/SiGeC and Si/Si1–yCy Heterostructures using Metal–Oxide–Semiconductor Capacitors," J. Appl. Phys. 85(2), pp. 978–984, Jan. 1999.
D.V. Singh, K. Rim, T.O. Mitchell, J.L. Hoyt and J.F. Gibbons, "Admittance Spectroscopy Analysis of the Conduction Band Offsets in Si/SiGeC and Si/Si1–yCy Heterostructures," J. Appl. Phys. 85(2), pp. 985–993, Jan. 1999.
K. Rim, J.L. Hoyt, and J.F. Gibbons, "Transconductance Enhancement in Deep Submicron Strained–Si n–MOSFETS," in IEEE IEDM Tech. Dig., pp. 707–710, Dec. 1998.
K. Rim, T.O. Mitchell, D.V. Singh, J.L. Hoyt, J.F. Gibbons, and G. Fountain, "Metal–oxide–semiconductor Capacitance–Voltage Characteristics and Band Offsets for Si1–yCy/Si Heterostructures," Appl. Phys. Lett. 72 (18), pp. 2286–2288 (1998).
J.L. Hoyt, T.O. Mitchell, K. Rim, D. Singh, and J.F. Gibbons, "Epitaxial Growth and Electronic Characterization of Carbon–Containing Silicon–based Heterostructures," invited paper presented at the Spring, 1998 MRS Meeting, San Francisco, CA, Apr. 13–17, in Mat. Res. Soc. Symp. Proc. vol. 533, (Mat. Res. Soc., Pittsburgh, PA, 1998), pp. 263–274.

(Continued)

Primary Examiner—Minhloan Tran
Assistant Examiner—Tan Tran
(74) Attorney, Agent, or Firm—Ostrolenk, Faber, Gerb & Soffen, LLP

(57) ABSTRACT

Semiconductor devices, e.g., heterojunction field effect transistors, fabricated with silicon-germnanium buffer layer and silicon-carbon channel layer structures. The invention provides a method of reducing threading defect density via reducing germanium content in a SiGe relaxed buffer layer on which a strained silicon channel layer is formed, by forming the strained silicon channel layer of a silicon-carbon alloy, e.g., containing less than about 1.5 atomic % C substitutionally incorporated in the Si lattice of the alloy.

38 Claims, 6 Drawing Sheets

OTHER PUBLICATIONS

K. Rim, T.O. Mitchell, J.L. Hoyt, G. Fountain, and J.F. Gibbons, "Characteristics of Surface–channel Strained Si1–ycy n–MOSFETs," {Conference presentation, presented at the Materials Research Society Spring Meeting, San Francisco, CA, Apr., 1998, in Mat. Res. Soc. Symp. Proc. vol. 533, (Mat. Res. Soc., Pittsburgh, PA, 1998), pp. 43–48.

S. Takagi, J.L. Hoyt, K. Rim, J. Welser, and J.F. Gibbons, "Evaluation of the Valence Band Discontinuity of Si/Si1–xGex/Si Heterostructures by Application of Admittance Spectroscopy to MOS Capacitors," IEEE Trans. Elec. Dev., 45 (2), pp. 493–501 (1998).

T.O. Mitchell, J.L. Hoyt, and J.F. Gibbons, "Substitutional Incorporation of Carbon in Epitaxial Si1–yCy Layers Grown by Chemical Vapor Deposition," Appl. Phys. Lett. 71 (12), pp. 1688–1690 (1997).

J.L. Hoyt, T.O. Mitchell, K. Rim, D.V. Singh, and J.F. Gibbons, "Comparison of Si/Si1–x–yGexCy and Si/Si1–yCy Heterojunctions Grown by Rapid Thermal Chemical Vapor Deposition," presented at the Seventh Intl. Symposium on Si Molecular Beam Epitaxy, Jul. 1997, Banff, Canada (article published in Thin Solid Films, vol. 321, pp. 41–46, Elsevier Science, 1998).

* cited by examiner

HETEROJUNCTION FIELD EFFECT TRANSISTORS USING SILICON-GERMANIUM AND SILICON-CARBON ALLOYS

BACKGROUND OF THE INVENTION

1. Field of the Invention

This invention relates to an improvement in so-called "strained silicon" or "band engineered transistor" technology, and encompasses heterojunction field effect transistors fabricated with silicon-germanium and silicon-carbon alloys.

2. Description of the Related Art

In the current evolution of semiconductor devices, the limits of traditional scalability of CMOS transistors are rapidly being approached. This circumstance in turn has motivated increasing focus on three major groups of new transistors for the future—ultra-thin body silicon-on-insulator (SOI) transistors, band-engineered transistors and double-gate transistors.

Ultra-thin SOI transistors are made in very thin films of silicon about 100–250 Angstroms in thickness.

Band-engineered transistors are based on the approach of using new or modified materials for CMOS devices so that electrons move faster through the structure, such as by use of germanium and induction of mechanical stress in the structure to artificially control and improve transistor performance.

Double-gate transistors involve several potential approaches, including "fin FET" and vertical transistor designs, in which one gate is placed at the top of the transistor structure and another gate is placed on the bottom portion of the transistor. Such approach holds the potential to reduce transistor gate lengths to dimensions as small as 9 nanometers (nm), a current goal in the 22-nm node set for 2016. At 9 nm, gate structures will only be on the order of 30 atoms in length.

Considering the foregoing transistor types, anticipated challenges associated with ultra-thin SOI transistors and with double-gate transistors implicate band-engineered transistors as leading candidates for high-performance CMOS transistor development in the near term.

A simple version of band-engineered transistor is shown in the photomicrograph of FIG. 1. As labeled in the photomicrograph, the poly gate is positioned in the center of the structure, with a strained-silicon channel underneath the gate. The source and drain elements are to the left and right, respectively, in relation to the gate, and the strained silicon is formed by growth on a strain-relaxed $Si_{0.85}Ge_{0.15}$ layer, as a SiGe "virtual substrate."

Such band-engineered transistor structures are more generally referred to as heterojunction field effect transistors (HFETs), and achieve mobility enhancement of charge carriers in operation by the presence of strain in the silicon layer. This charge carrier mobility enhancement is more significant for electrons than for holes. Mobility enhancements of 80% for NMOS HFET structures and 60% for PMOS HFET structures have been reported for strained silicon on $Si_{0.7}Ge_{0.3}$ (Currie, M., et al., JVST B19, 2268 (2001).

In such band-engineered HFET devices, the strained silicon layers are grown on strain-relaxed SiGe, which in turn is grown on silicon wafers. The strain-relaxed SiGe, commonly referred to as a SiGe relaxed buffer layer (RBL), is used as a "virtual substrate" for the silicon layer in this structural arrangement. RBLs and strained channel layers have been grown by molecular beam epitaxy (MBE) as well as chemical vapor deposition (CVD). Strained Si-channel layers, also termed quantum wells, are typically about 100–250 Angstroms in thickness.

FIG. 2 shows a cross-sectional tunneling electron microscope (TEM) image of a SiGe relaxed buffer layer structure. The compositionally graded layer is seen in the image to be a region of high dislocation density, with a low defect density material above it formed by the constant-Ge-composition "cap" layer of the RBL. In the field of view shown in the image, one threading dislocation is seen to extend up to the surface of the RBL.

In general, RBLs have three major requirements. They must have sufficient germanium content, often with a mole fraction of Ge in a range of 0.15–0.3, in the capping layer. The capping layer nominally is on the order of 1 micrometer ($\mu$m) in thickness. Second, RBLs must have the lowest defect density possible in the capping material. Third, the RBL structure must have a sufficiently smooth film for photolithographic processing after strained silicon growth.

In the fabrication of strained silicon growth structures, defects form as a result of a 4% difference in lattice constants between Si and Ge during the growth of Ge-containing layers on silicon. The associated inherent strain will produce misfit dislocations at sufficient thickness of the Ge-containing layer. The current state of the art is able to achieve a threading misfit dislocation density level just below $1 \times 10^5$ defects per square centimeter ($cm^2$) for an illustrative 30% RBL (containing $Si_{0.7}Ge_{0.3}$).

One of the limitations of using SiGe for fabricating RBLs is the requirement of a high germanium content in the relaxed buffer layer (involving a mole fraction of Ge, as mentioned, that is typically in the range of 0.15 to 0.30), in order to achieve sufficient strain and consequent band-bending in the silicon channel. Since threading dislocation density and surface roughness of RBLs increase with increasing germanium content, it would be desirable to minimize Ge content in the RBL structure, but without the loss of performance that reduction of Ge-content in the RBL layer otherwise entails.

SUMMARY OF THE INVENTION

The present invention relates to semiconductor device structures fabricated using silicon-germanium alloy buffer layers and silicon-based channel layers, and to methods of making the same.

The invention in one aspect relates to a strained silicon semiconductor device structure, comprising a relaxed buffer layer (RBL), and a strained silicon layer on said RBL, wherein said RBL comprises a silicon-germanium alloy, and said strained silicon layer comprises a silicon-carbon alloy.

The invention in a specific device aspect relates to a heterojunction field effect transistor including a relaxed buffer layer (RBL) comprising a silicon-germanium alloy, and a channel layer on the RBL comprising a silicon-carbon alloy including from about 0.5 to about 1.0 atomic % based on the total of silicon and carbon in said channel layer, wherein the silicon-germanium alloy includes about 10 to about 30 atomic % germanium, the channel layer is from about 10 to about 25 nanometers in thickness, and the RBL has a threading dislocation density, measured at a surface thereof adjacent the channel layer, which does not exceed $10^5$ defects/$cm^2$.

Another aspect of the invention relates to a method of fabricating a semiconductor device structure including an SiGe relaxed buffer layer (RBL) and a silicon channel layer on the RBL, such method comprising forming said silicon channel layer of a material comprising a silicon-carbon alloy.

A still further aspect of the invention relates to a method of reducing threading defect density by reducing germanium content in a SiGe relaxed buffer layer on which a strained silicon channel layer is formed in fabrication of a semiconductor device structure, said method comprising forming said strained silicon channel layer of a material comprising a silicon-carbon alloy.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
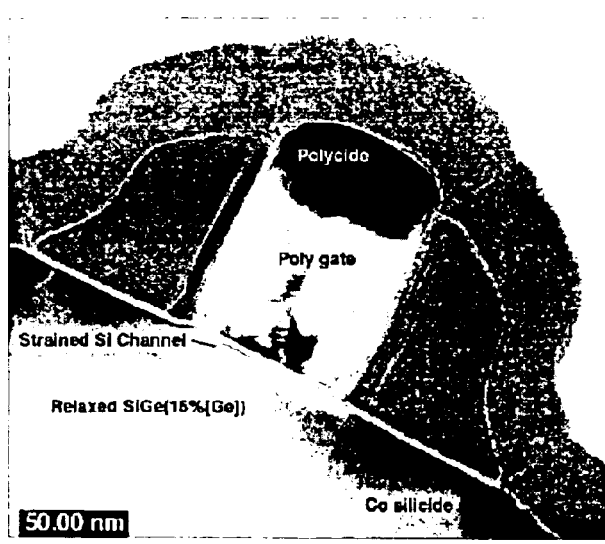
FIG. 1 is a photomicrograph of a strained silicon HFET structure in which the strained silicon channel is grown on a strain-relaxed $Si_{0.85}Ge_{0.15}$ layer, wherein the strain-relaxed $Si_{0.85}Ge_{0.15}$ layer serves as a virtual substrate.
Figure 2:
FIG. 2 shows a cross-sectional tunneling electron microscope (TEM) image of a SiGe relaxed buffer layer structure.

The present invention provides a germanium-based RBL structure that is usefully employed, e.g., in an HFET device, in which lower germanium content in the RBL material is enabled without reduction of performance that is otherwise observed when Ge content of the SiGe layer is reduced.

The present invention is based on the discovery that the strained silicon layer in an HFET structure may be replaced by a strained Si—C alloy, e.g., an alloy containing nominally 0.5–1.0% carbon, to enable the use of lower germanium content in the relaxed buffer layer, while achieving at least equivalent electron and hole mobility in the strained channel (quantum well).

The use of lower germanium content buffer layers in turn enables the achievement of lower threading dislocation densities, improved surface morphologies, improved economics of buffer layer growth, as well as the potential in specific applications to reduce or even eliminate the smoothing requirements (e.g., the need for chemical mechanical planarization (CMP)) of the buffer layer before strained silicon growth is carried out. In the latter respect, the economics of device fabrication are substantially improved by reducing or eliminating the smoothing requirements, since smoothing requires at least two epitaxial growth cycles.

The use of silicon-carbon alloys in the strained silicon layer of the HFET device to enable use of lower germanium content buffer and cap layers, in accordance with the present invention, provides the advantages discussed hereinabove, without compromising the strain characteristics of the silicon channel or the performance of the HFET device.

The present invention provides a strained silicon semiconductor device structure, including a relaxed buffer layer (RBL), and a strained silicon layer on the RBL, in which the RBL includes a silicon-germanium alloy, and the strained silicon layer includes a silicon-carbon alloy.

In such device structure, the silicon-carbon alloy in one preferred aspect contains from about 0.2 to about 1.5 atomic % of carbon, based on the total silicon and carbon in the alloy. More preferably, the silicon-carbon alloy contains from about 0.4 to about 1.2 atomic % of carbon, based on the total silicon and carbon in the alloy, and most preferably, the silicon-carbon alloy contains from about 0.5 to about 1.0 atomic % of carbon, on the total silicon and carbon basis.

Preferably, the amount of carbon in the silicon-carbon alloy is such that substantially all of the carbon atoms are substitutionally incorporated in the alloy, as a component in the silicon lattice. The amount of carbon in the alloy preferably is below the carbon concentration threshold for alloy scattering.

In various preferred device structures of the invention, the strained silicon layer preferably has a thickness of from about 5 to about 50 nanometers, more preferably from about 8 to about 40 nanometers, and most preferably from about 10 to about 20 nanometers.

The silicon-germanium alloy in preferred device structures of the invention preferably has a formula $Si_xGe_{1-x}$ wherein x is from about 0.6 to about 0.95, more preferably from about 0.65 to about 0.90, and most preferably from about 0.7 to about 0.85.

Device structures of the invention include those wherein the RBL has a threading dislocation density, measured at a top surface thereof adjacent the strained silicon layer, which does not exceed $10^5$ defects/cm$^2$.

Device structures of the invention are implementable in a wide variety of semiconductor devices and device precursor structures, e.g., heterojunction CMOS devices, including transistor devices of varied types, including, without limitation, HFETs, MOSFETs and MODFETs. Devices according to the invention are readily fabricated within the skill of the art on a wide variety of substrates, preferably silicon substrates (Si, SiC, etc.), but also including non-silicon substrates (sapphire, GaAs, GaN, etc.).

As an illustrative embodiment of the invention, a heterojunction field effect transistor can be fabricated in accordance with the invention, including a relaxed buffer layer (RBL) formed of a silicon-germanium alloy, with a channel layer on the RBL formed of a silicon-carbon alloy including from about 0.5 to about 1.0 atomic % based on the total of silicon and carbon in the channel layer, in which the silicon-germanium alloy includes about 10 to about 30 atomic % germanium, the channel layer is from about 10 to about 20 nanometers in thickness, and the RBL has a threading dislocation density, measured at a surface thereof adjacent the channel layer, which does not exceed $10^5$ defects/cm$^2$.

The invention thus enables fabrication of a semiconductor device structure including an SiGe relaxed buffer layer (RBL) and a silicon channel layer on the RBL, in which the silicon channel layer is formed of a silicon-carbon alloy, e.g., a silicon-carbon alloy containing from about 0.2 to about 1.5 atomic % of carbon, based on the total silicon and carbon in the alloy, more preferably from about 0.4 to about 1.2 atomic % of carbon, based on the total silicon and carbon in the alloy, and most preferably from about 0.5 to about 1.0 atomic % of carbon, based on the total silicon and carbon in the alloy.

The fabrication method is preferably carried out so that the carbon in the silicon-carbon alloy is substantially completely in the form of carbon atoms that are substitutionally incorporated in the silicon-carbon alloy, as opposed to being interstitially incorporated in the alloy lattice. As mentioned, the amount of carbon in the silicon-carbon alloy desirably is below the carbon concentration threshold for alloy scattering.

The silicon channel layer thickness preferably is from about 5 to about 50 nanometers, more preferably from about 8 to about 40 nanometers, and most preferably from about 10 to about 20 nanometers, and the RBL preferably is constituted by a silicon-germanium alloy having a formula $Si_xGe_{1-x}$ wherein x is from about 0.6 to about 0.95, more preferably from about 0.65 to about 0.90, and most preferably from about 0.7 to about 0.85.

In such fabrication method, the RBL preferably is grown under conditions producing a threading dislocation density, measured at a top surface thereof adjacent the silicon channel layer, which does not exceed $10^5$ defects/cm$^2$.

The preferred method of forming the silicon channel layer of the silicon-carbon alloy, is by chemical vapor deposition (CVD) or by molecular beam epitaxy (MBE). When CVD is employed as the technique for forming the silicon channel layer, CVD growth preferably is carried out at temperature not exceeding 550° C., at a growth rate in a range of from about 1 to about 2 nanometers per minute, to grow the silicon channel layer to a thickness of from about 10 to about 20 nanometers.

The method of the invention therefore provides a technique for reducing threading defect density by reducing germanium content in a SiGe relaxed buffer layer on which a strained silicon channel layer is formed in the fabrication of a semiconductor device structure. By forming the strained silicon channel layer of a silicon-carbon alloy, Ge content can be significantly reduced in the SiGe composition of the RBL, with the attendant advantages discussed hereineaarlier.

Figure 3:
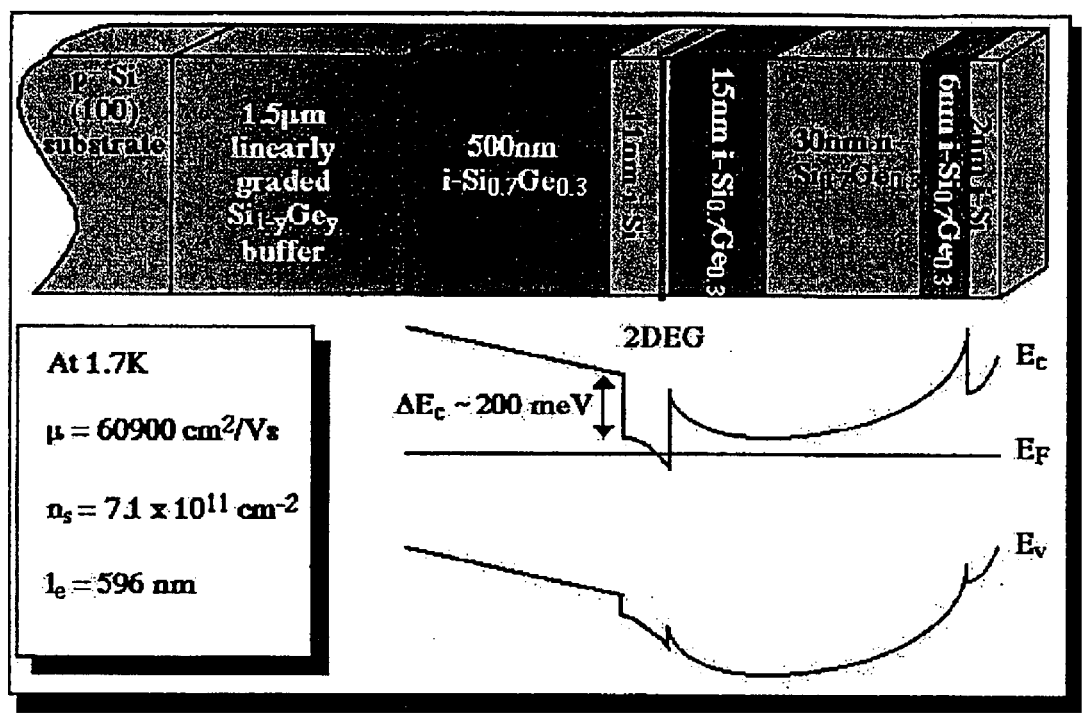
FIG. 3 is a diagram of the layer structure and the band energy for a SiGe-based HFET device featuring a 2-dimensional electron gas in a strained silicon channel (source and drain regions not shown).

Semiconductor device structures in accordance with the present invention can be fabricated in a variety of specific forms. By way of specific examples, the epitaxial layer structure can be of a form as shown in FIG. 1 or FIG. 3, but wherein the intrinsic Si layer is replaced with intrinsic Si—C, e.g., with a concentration of carbon on the order of 1 atomic %, and wherein the germanium content of the SiGe buffer and cap layers is reduced, e.g., to about 8% for a 1% carbon alloy, or to about 4% for a 0.5% carbon alloy, each of such strained Si layer/SiGe buffer layer compositions achieving approximately equivalent band offset in the corresponding device structure.

FIG. 1 as described hereinabove is a strained silicon HFET structure in which the strained silicon channel is grown on a strain-relaxed SiGe layer, wherein the strain-relaxed SiGe layer serves as a virtual substrate. FIG. 3 is a diagram of the layer structure and the band energy for a simple SiGe-based HFET device (n- or p-MOSFET) featuring a strained silicon channel (source and drain regions not shown) wherein, in accordance with one embodiment of the invention, the intrinsic Si layer is replaced with intrinsic Si—C alloy material having a carbon content of from about 0.5 to about 1 atomic %, and the germanium content in the SiGe buffer and cap layers is significantly reduced (e.g., in a range of from about 4 to about 10%, relative to corresponding device structures having silicon (instead of the carbosilicon alloy composition of the present invention) in their channel layers.

Figure 4:
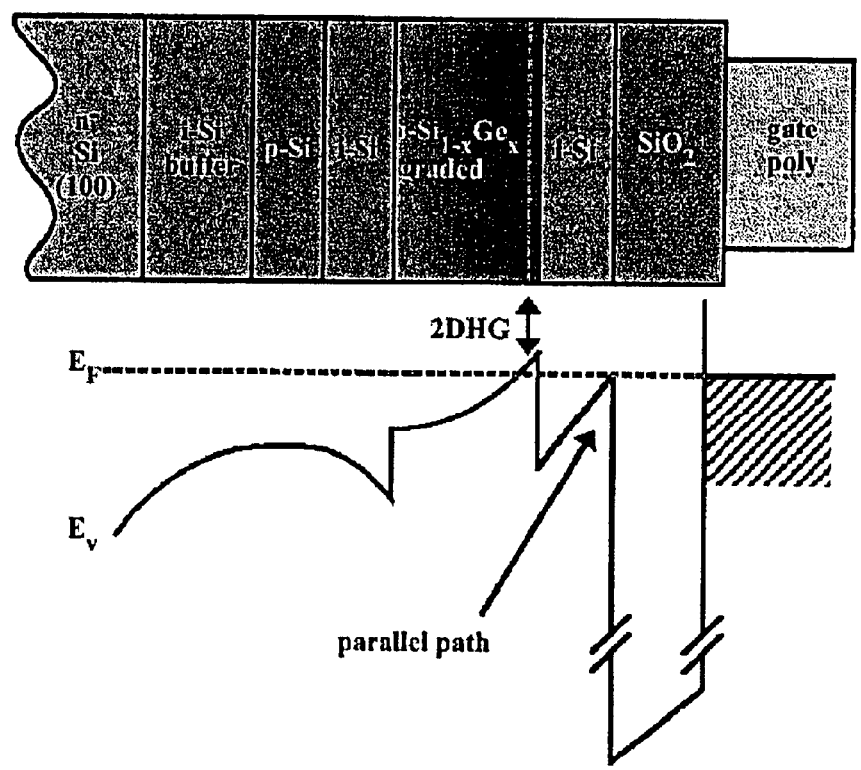
FIG. 4 is a diagram of the layer structure and the band energy for a SiGe-based p-MOSFET device.

The Si—C alloy/reduced Ge content buffer/cap arrangement of the present invention is also susceptible of implementation in other HCMOS devices. Heterojunction CMOS devices can be readily fabricated within the skill of the art using the basic structures shown in FIGS. 1 and 4, or other, more complex structures. FIG. 1 has already been described. FIG. 4 is a diagram of the layer structure and the band energy for a SiGe-based p-MOSFET device.

Figure 5:
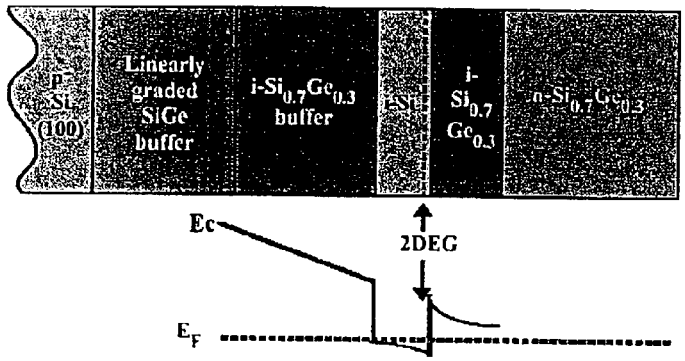
FIG. 5 is a diagram of the layer structure and the band energy for a SiGe-based n-channel SiGe/Si HFET device.
Figure 6:
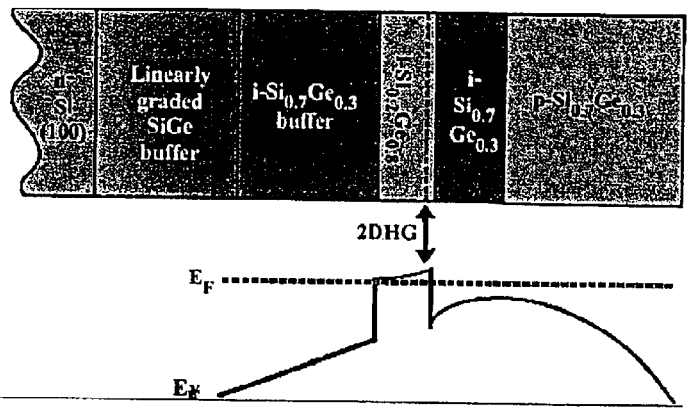
FIG. 6 is a diagram of the layer structure and the band energy for a SiGe-based p-channel SiGe/Si HFET device.

FIG. 5 is a diagram of the layer structure and the band energy for a SiGe-based n-channel SiGe/Si HFET device. FIG. 6 is a diagram of the layer structure and the band energy for a corresponding SiGe-based p-channel SiGe/Si HFET device.

Figure 7:
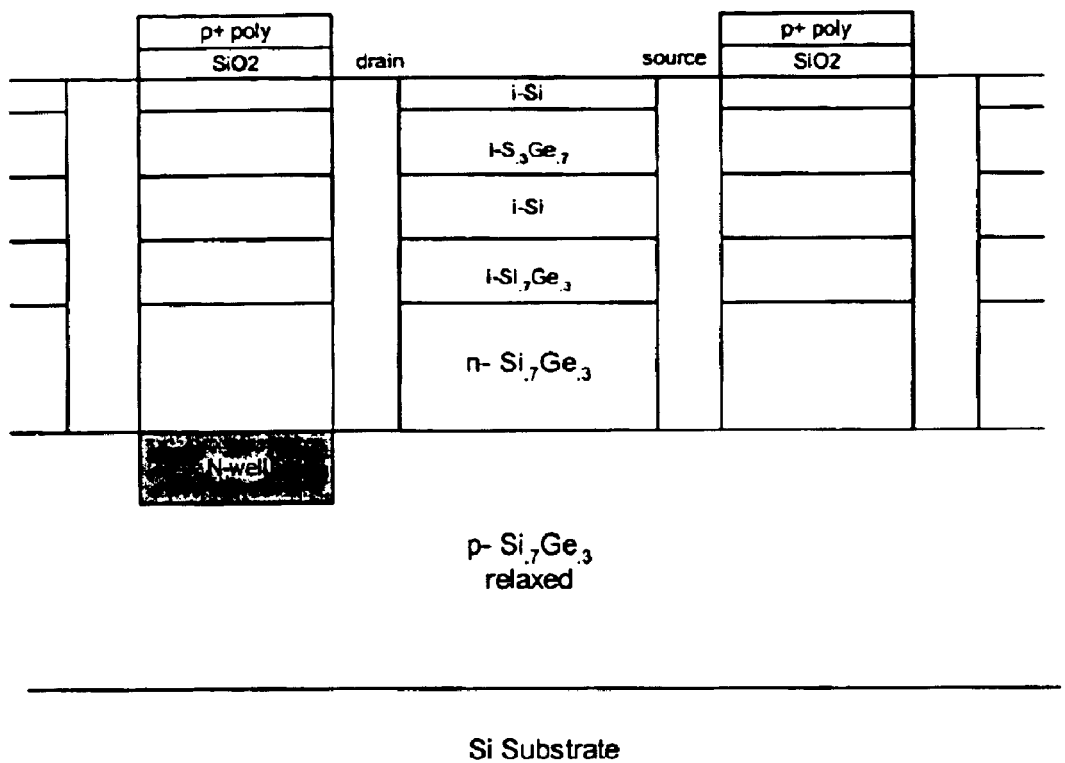
FIG. 7 is a schematic representation of a SiGe-based heterojunction CMOS device.
Figure 8:
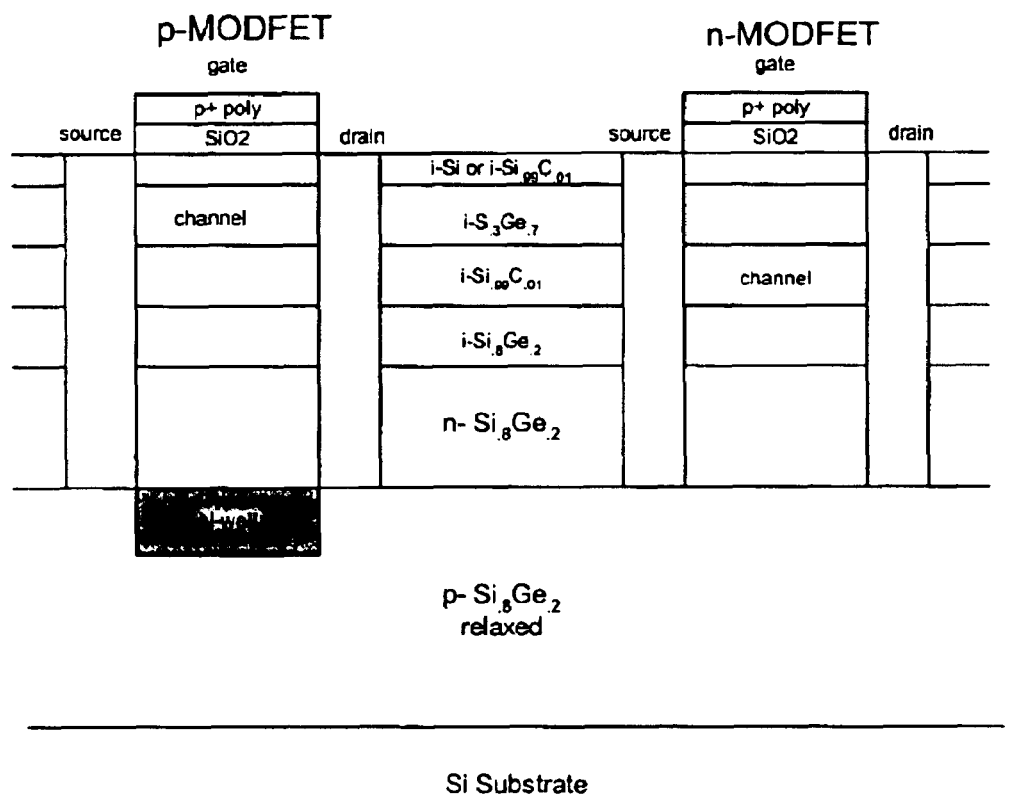
FIG. 8 is a schematic representation of a MODFET device featuring carbon incorporation in the strained silicon layer.

FIGS. 5 and 6 show epitaxial layer structures that can be grown for high-mobility n-and p-channels using Si and SiGe. The p-channel structure has a higher germanium content than the buffer. Structures of the types shown in FIGS. 5 and 6 can be fabricated in accordance with the present invention, using Si—C alloys to enable the reduction of germanium in the buffer layer. Still other device structures that can be fabricated in accordance with the present invention include the SiGe-based heterojunction CMOS device shown in FIG. 7 and the MODFET device of FIG. 8.

The invention therefore affords a means of achieving equivalent device performance with reduced dislocation density and reduced surface roughness of the RBL.

In carrying out the growth of the Si—C alloy, carbon is introduced to the growing silicon film to constitute the Si—C alloy in any suitable manner, e.g., utilizing a carbon precursor such as methane, methyl silane or other hydrocarbonaceous material, or other material used in the art for carbon doping of semiconductor materials, in an amount appropriate for forming the Si—C alloy of desired carbon content.

The buffer layer and cap layers can be formed with the lower germanium content enabled by the present invention in an otherwise conventional manner as regards the growth or deposition process and process conditions employed, as for example described in U.S. Pat. No. 5,221,413 issued Jun. 22, 1993 to D. Brasen et al. and assigned to AT&T Bell Laboratories, and U.S. Pat. No. 6,107,053 issued Aug. 22, 2000 to E. A. Fitzgerald and assigned to Massachusetts Institute of Technology, the disclosure of which hereby is incorporated herein by reference in its entirety.

The silicon-carbon alloy layer and reduced Ge-content buffer layers can be formed, for example, by chemical vapor deposition or by molecular beam epitaxy.

The silicon-carbon alloy growth process is desirably conducted to minimize alloy scattering that would otherwise reduce the effective electron mobility in the Si—C alloy layer. More specifically, the Si—C alloy growth process desirably minimizes interstitial incorporation of carbon in the alloy film lattice structure, and maximizes substitutional incorporation of carbon, i.e., presence of carbon atoms at substitutional sites in the alloy film lattice structure. To achieve essentially complete (~100%) substitutional carbon incorporation, in preferred practice the amount of carbon in the Si—C alloy does not exceed about 1.5 atomic %.

In the preferred practice of the invention for the achievement of Si—C alloy films of the above-described substitutional type, CVD growth temperatures on the order of about 550–600° C., and growth rates in the vicinity of about 1 to about 10 nm/minute, are desirably employed. Such growth temperature and growth rate are much lower than temperatures and growth rates typically employed for most Si epitaxial CVD processes, but this is not a significant limitation on the practice of the invention, since the Si—C alloy films are relatively thin, typically being in a range of from about 10 to about 20 nm in thickness.

Other growth techniques can be correspondingly adjusted in temperature conditions and growth rate to favor substantially exclusive substitutional incorporation of carbon in the silicon alloy lattice structure. For example, molecular beam epitaxy may be carried out at temperatures below 550° C. Accordingly, the specific growth technique and process conditions employed for formation of the Si—C alloy layer are readily determinable within the skill of the art and without undue experimentation, to produce the Si—C alloy material and structure of the desired character.

The features and advantages of the invention are more fully shown by the following non-limiting example.

EXAMPLE

In an illustrative embodiment, a relaxed buffer layer having a composition of $Si_xGe_{1-x}$ is grown on a silicon wafer substrate by chemical vapor deposition using dichlorosilane as the silicon precursor and germane as the germanium precursor, at a flow rate to the CVD chamber of 20 standard liters per minute of hydrogen, 200 standard milliliters per minute of dichlorosilane and a flow rate of 10% germane in hydrogen that varies during the growth cycle (0 to 300 standard milliliters per minute). The growth conditions include a temperature of 800° C., and a pressure of 20 torr. Defect density in the near-surface region of the wafer is reduced by compositional grading, which may be combined with thermal annealing cycles. The temperature is reduced to approximately 580° C., and a layer of Si.99C.01 is grown with the following reactor gas flow rates: 100 standard milliliters of silane, 10 standard liters of Hydrogen, and 85 standard milliters of methyl silane. The growth rate of this layer is approximately 30 Å/minute. Increased growth rates may be achieved by substituting disilane for silane.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art. The invention therefore is to be broadly construed, consistent with the claims hereafter set forth.

What is claimed is:

1. A strained silicon semiconductor device structure, comprising a relaxed buffer layer (RBL) formed on a substrate, and a strained silicon layer on said RBL, wherein said RBL comprises a silicon-germanium alloy, and said strained silicon layer comprises a silicon-carbon alloy, and wherein the RBL has a threading dislocation density, measured at a top surface thereof adjacent the strained silicon layer, which does not exceed $10^5$ defects/cm$^2$.

2. The device structure of claim 1, wherein said silicon-carbon alloy contains from about 0.2 to about 1.5 atomic % of carbon, based on the total silicon and carbon in said alloy.

3. The device structure of claim 1, wherein said silicon-carbon alloy contains from about 0.4 to about 1.2 atomic % of carbon, based on the total silicon and carbon in said alloy.

4. The device structure of claim 1, wherein said silicon-carbon alloy contains from about 0.5 to about 1.0 atomic % of carbon, based on the total silicon and carbon in said alloy.

5. The device structure of claim 1, wherein the amount of carbon in said silicon-carbon alloy is such that substantially all of the carbon atoms are substitutionally incorporated in said silicon-carbon alloy.

6. The device structure of claim 1, wherein the amount of carbon in said silicon-carbon alloy is below the carbon concentration threshold for alloy scattering.

7. The device structure of claim 1, wherein the strained silicon layer has a thickness of from about 5 to about 50 nanometers.

8. The device structure of claim 1, wherein the strained silicon layer has a thickness of from about 8 to about 40 nanometers.

9. The device structure of claim 1, wherein the strained silicon layer has a thickness of from about 10 to about 20 nanometers.

10. The device structure of claim 1, wherein said silicon-germanium alloy has a formula $Si_xGe_{1-x}$ wherein x is from about 0.6 to about 0.95.

11. The device structure of claim 1, wherein said silicon-germanium alloy has a formula $Si_xGe_{1-x}$ wherein x is from about 0.65 to about 0.90.

12. The device structure of claim 1, wherein said silicon-germanium alloy has a formula $Si_xGe_{1-x}$ wherein x is from about 0.7 to about 0.85.

13. The device structure of claim 1, incorporated in a semiconductor device.

14. The device structure of claim 13, wherein the semiconductor device comprises a heterojunction CMOS device.

15. The device structure of claim 13, wherein the semiconductor device comprises a transistor device.

16. The device structure of claim 15, wherein said transistor device comprises an HFET.

17. The device structure of claim 15, wherein said transistor device comprises an MOSFET.

18. The device structure of claim 16, wherein said transistor device comprises an MODFET.

19. The device structure of claim 1, on a silicon wafer substrate.

20. A heterojunction field effect transistor including a relaxed buffer layer (RBL) comprising a silicon-germanium alloy, and a channel layer on the RBL comprising a silicon-carbon alloy including from about 0.5 to about 1.0 atomic % based on the total of silicon and carbon in said channel layer, wherein the silicon-germanium alloy includes about 10 to about 30 atomic % germanium, the channel layer is from about 10 to about 20 nanometers in thickness, and the RBL has a threading dislocation density, measured at a surface thereof adjacent the channel layer, which does not exceed $10^5$ defects/cm$^2$.

21. A method of fabricating a semiconductor device structure including an SiGe relaxed buffer layer (RBL) formed on a substrate and a strained silicon channel layer on the RBL, said method comprising forming said silicon channel layer of a material comprising a silicon-carbon alloy, and wherein the RBL has a threading dislocation density, measured at a top surface thereof adjacent the strained silicon channel layer, which does not exceed $10^5$ defects/cm$^2$.

22. The method of claim 21, wherein said silicon-carbon alloy contains from about 0.2 to about 1.5 atomic % of carbon, based on the total silicon and carbon in said alloy.

23. The method of claim 21, wherein said silicon-carbon alloy contains from about 0.4 to about 1.2 atomic % of carbon, based on the total silicon and carbon in said alloy.

24. The method of claim 21, wherein said silicon-carbon alloy contains from about 0.5 to about 1.0 atomic % of carbon, based on the total silicon and carbon in said alloy.

25. The method of claim 21, wherein the amount of carbon in said silicon-carbon alloy is such that substantially all of the carbon atoms are substitutionally incorporated in said silicon-carbon alloy.

26. The method of claim 21, wherein the amount of carbon in said silicon-carbon alloy is below the carbon concentration threshold for alloy scattering.

27. The method of claim 21, wherein the silicon channel layer has a thickness of from about 5 to about 50 nanometers.

28. The method of claim 21, wherein the silicon channel layer has a thickness of from about 8 to about 40 nanometers.

29. The method of claim 21, wherein the silicon channel layer has a thickness of from about 10 to about 20 nanometers.

30. The method of claim 21, wherein said RBL comprises a silicon-germanium alloy having a formula $Si_xGe_{1-x}$ wherein x is from about 0.6 to about 0.95.

31. The method of claim 21, wherein said RBL comprises a silicon-germanium alloy having a formula $Si_xGe_{1-x}$ wherein x is from about 0.65 to about 0.90.

32. The method of claim 21, wherein said RBL comprises a silicon-germanium alloy having a formula $Si_xGe_{1-x}$ wherein x is from about 0.7 to about 0.85.

33. The method of claim 21, wherein the semiconductor device structure comprises a heterojunction CMOS device.

34. The method of claim 21, wherein the semiconductor device structure comprises a transistor device.

35. The method of claim 21, wherein the semiconductor device structure comprises an HFET.

36. The method of claim 21, wherein the semiconductor device structure comprises an MOSFET.

37. The method of claim 21, wherein the semiconductor device structure comprises an MOSFET.

38. A method of fabricating a strained semiconductor device structure including a relaxed buffer layer (RBL) formed on a substrate and a strained silicon layer on said RBL, said method comprising the steps of forming said RBL of a material comprising a silicon-germanium alloy and forming said strained silicon layer of a material comprising a silicon-carbon alloy, wherein the RBL is grown under conditions producing a threading dislocation density, measured at a top surface thereof adjacent the silicon channel layer, which does not exceed $10^5$ defects/cm$^2$.

* * * * *